United States Patent
Low et al.

(10) Patent No.: US 8,598,547 B2
(45) Date of Patent: Dec. 3, 2013

(54) HANDLING BEAM GLITCHES DURING ION IMPLANTATION OF WORKPIECES

(75) Inventors: Russell J. Low, Rowley, MA (US); Atul Gupta, Beverly, MA (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 275 days.

(21) Appl. No.: 13/170,815

(22) Filed: Jun. 28, 2011

(65) Prior Publication Data

US 2011/0315899 A1    Dec. 29, 2011

Related U.S. Application Data

(60) Provisional application No. 61/359,649, filed on Jun. 29, 2010.

(51) Int. Cl.
*A61N 5/00* (2006.01)
*G21G 5/00* (2006.01)

(52) U.S. Cl.
USPC ............ 250/492.3; 250/492.21; 250/423 R; 250/492.1; 257/79; 257/85; 438/58; 438/98

(58) Field of Classification Search
USPC ............ 250/492.21, 492.3, 423 R, 492.1; 257/79, 85; 438/58, 98
See application file for complete search history.

(56) References Cited

U.S. PATENT DOCUMENTS

| | | | |
|---|---|---|---|
| 5,304,509 A * | 4/1994 | Sopori | 438/58 |
| 6,828,204 B2 | 12/2004 | Renau | |
| 7,005,657 B1 | 2/2006 | Low et al. | |
| 7,282,427 B1 | 10/2007 | Murrell et al. | |
| 7,361,913 B2 | 4/2008 | Low et al. | |
| 7,507,977 B2 | 3/2009 | Weiguo et al. | |
| 7,544,957 B2 | 6/2009 | Walther et al. | |
| 2006/0113489 A1* | 6/2006 | Ray et al. | 250/492.21 |
| 2006/0219954 A1* | 10/2006 | Low et al. | 250/492.21 |
| 2006/0240651 A1 | 10/2006 | Renau et al. | |
| 2007/0114456 A1 | 5/2007 | Yasuda | |
| 2009/0317937 A1 | 12/2009 | Gupta et al. | |
| 2011/0039367 A1 | 2/2011 | Bateman et al. | |

FOREIGN PATENT DOCUMENTS

JP    2001167727 A    6/2001

* cited by examiner

*Primary Examiner* — Jack Berman
*Assistant Examiner* — Meenakshi Sahu

(57) ABSTRACT

Glitches during ion implantation of a workpiece, such as a solar cell, can be compensated for. In one instance, a workpiece is implanted during a first pass at a first speed. This first pass results in a region of uneven dose in the workpiece. The workpiece is then implanted during a second pass at a second speed. This second speed is different from the first speed. The second speed may correspond to the entire workpiece or just the region of uneven dose in the workpiece.

23 Claims, 7 Drawing Sheets

HANDLING BEAM GLITCHES DURING ION IMPLANTATION OF WORKPIECES

CROSS-REFERENCE TO RELATED APPLICATIONS

This application claims priority to the provisional patent application entitled "Handling Beam Glitches During Solar Cell Implantation," filed Jun. 29, 2010 and assigned U.S. application Ser. No. 61/359,649, the disclosure of which is hereby incorporated by reference.

FIELD

This invention relates to ion implantation of workpieces and, more particularly, to forming solar cells using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of a clean energy technology.

There are many different solar cell architectures. Two specific designs are the selective emitter (SE) and the interdigitated backside contact (IBC). A SE solar cell has high-dose regions across the lightly doped surface to enable better current generation in the lightly doped regions while enabling low-resistance contacts for current collection in the high-dose regions. An IBC solar cell has alternating p-type and n-type regions across the surface not impinged by sunlight. Both a SE and IBC solar cell may be implanted to dope the various n-type or p-type regions.

"Glitches" may occur during implantation. A glitch is when the beam quality is suddenly degraded in the middle of an implantation operation, potentially rendering the workpiece unusable. Such a glitch can be caused at various locations along the beam path. Ion implanters generally employ several electrodes along the beam path, which accelerate the beam, decelerate the beam, or suppress spurious streams of electrons that are generated during operation. Generally, glitches occur across acceleration gaps, deceleration gaps, or suppression gaps, although glitches may occur elsewhere. These glitches may be detected as a sharp change in the current from one of the power supply units for the electrodes. This causes a change in the delivered ion dose to the workpiece surface. Due to the threat of potential impact to the performance of the workpiece being implanted, glitches can be quite costly. Thus, steps are usually taken to both minimize the occurrence of such glitches and to recover from the glitches if possible.

When a glitch is detected, one solution is to immediately reduce the ion beam current to zero, thus terminating the implantation at a defined location on the workpiece. Once the glitch condition has been removed, implantation ideally resumes at exactly the same location on the workpiece with ideally the same beam characteristics that existed when the glitch was detected. The goal is to achieve a uniform doping profile, and this can be achieved by controlling the beam current, the workpiece scan speed, or the workpiece exposure time. Repairing the dose loss caused by the glitch in such a manner may take over 30 seconds, which may be too time-consuming for the throughput demands of certain workpiece manufacturing industries, such as the solar cell industry. Therefore, there is a need in the art for an improved method of glitch recovery for the implantation of workpieces such as solar cells.

SUMMARY

According to a first aspect of the invention, a method of ion implantation is provided. The method comprises implanting a first workpiece during a first pass at a first speed. The first pass results in a region of uneven dose in the first workpiece. The first workpiece is implanted during a second pass at a second speed. The second speed is different from the first speed.

According to a second aspect of the invention, a method of workpiece fabrication is provided. The method comprises implanting a workpiece. The implanting results in a region of uneven dose in the workpiece. Metal contacts are applied to the workpiece orthogonal to the region of uneven dose.

According to a third aspect of the invention, a method of ion implantation is provided. The method comprises implanting at least one workpiece. A region of uneven dose in the workpiece caused by the implanting is detected. Additional implantation into the workpiece is performed whereby an entirety of the workpiece has a larger dose after the additional implantation than after the implanting.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of this method are described herein in connection with an ion implanter. Beamline ion implanters, plasma doping ion implanters, or flood ion implanters may be used. Any n-type or p-type dopants may be used, but the embodiments herein are not limited solely to dopants. Furthermore, embodiments of this process may be applied to many solar cell architectures or even other workpieces such as semiconductor wafers, light-emitting diodes (LEDs), or flat panels. While various passes or speeds are referred to "first" or "second," this nomenclature is used for simplicity. The "first" pass when the glitch occurs may actually be, for example, the fourth overall pass during implantation of a workpiece. Thus, the invention is not limited to the specific embodiments described below.

Figure 1:
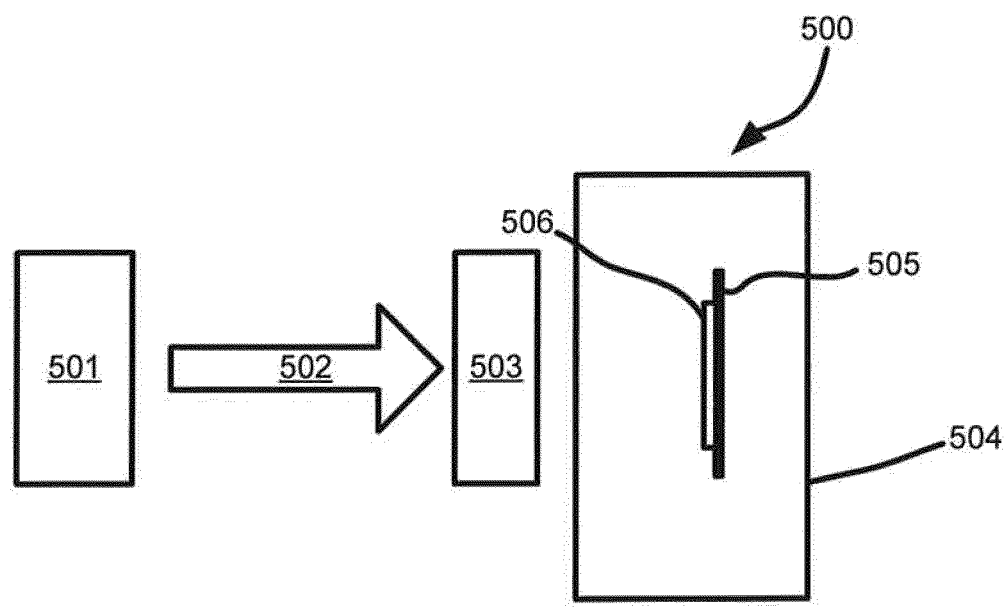
FIG. 1 is a simplified block diagram of a beam-line ion implanter.

FIG. 1 is a simplified block diagram of a beam-line ion implanter. Those skilled in the art will recognize that the beam-line ion implanter 500 is only one of many examples of differing beam-line ion implanters. In general, the beam-line ion implanter 500 includes an ion source 501 to generate ions that are extracted to form an ion beam 502, which may be, for example, a ribbon beam or a spot beam. The ion beam 502 of FIG. 1 may correspond to the ions used for implanting in the embodiments disclosed herein.

The ion beam 502 may be mass analyzed and converted from a diverging ion beam to a ribbon ion beam with substantially parallel ion trajectories in one instance. The ion beam 502 may not be mass analyzed prior to implantation in another instance. The beam-line ion implanter 500 may further include an acceleration or deceleration unit 503 in some embodiments.

An end station 504 supports one or more workpieces, such as the workpiece 506, in the path of the ion beam 502 such that ions of the desired species are implanted into workpiece 506. The end station 504 may include workpiece holder, such as platen 505, to support the workpiece 506. The workpiece holder also may be other mechanisms such as a conveyor belt. This particular end station 504 also may include a scanner (not illustrated) for moving the workpiece 506 perpendicular to the long dimension of the ion beam 502 cross-section, thereby distributing ions over the entire surface of workpiece 506.

The beam-line ion implanter 500 may include additional components known to those skilled in the art such as automated workpiece handling equipment, Faraday sensors, or an electron flood gun. It will be understood to those skilled in the art that the entire path traversed by the ion beam 502 is evacuated during ion implantation. The beam-line ion implanter 500 may incorporate hot or cold implantation of ions in some embodiments.

Glitches may occur within an ion implanter, such as the beam-line ion implanter 500. If this glitch is sufficiently short and the number of passes over a workpiece sufficiently large, it may be possible to ignore the glitch because there will likely be no effect to the workpiece. However, at some point the glitch is large enough or the glitch recovery time may be long enough that the glitch cannot be ignored because a significant dose loss will result and, if the workpiece is a solar cell, the solar cell efficiency may be affected. If a glitch with such significant dose loss occurs, then the damage caused by the glitch may be repaired to avoid yield loss.

Figure 2:
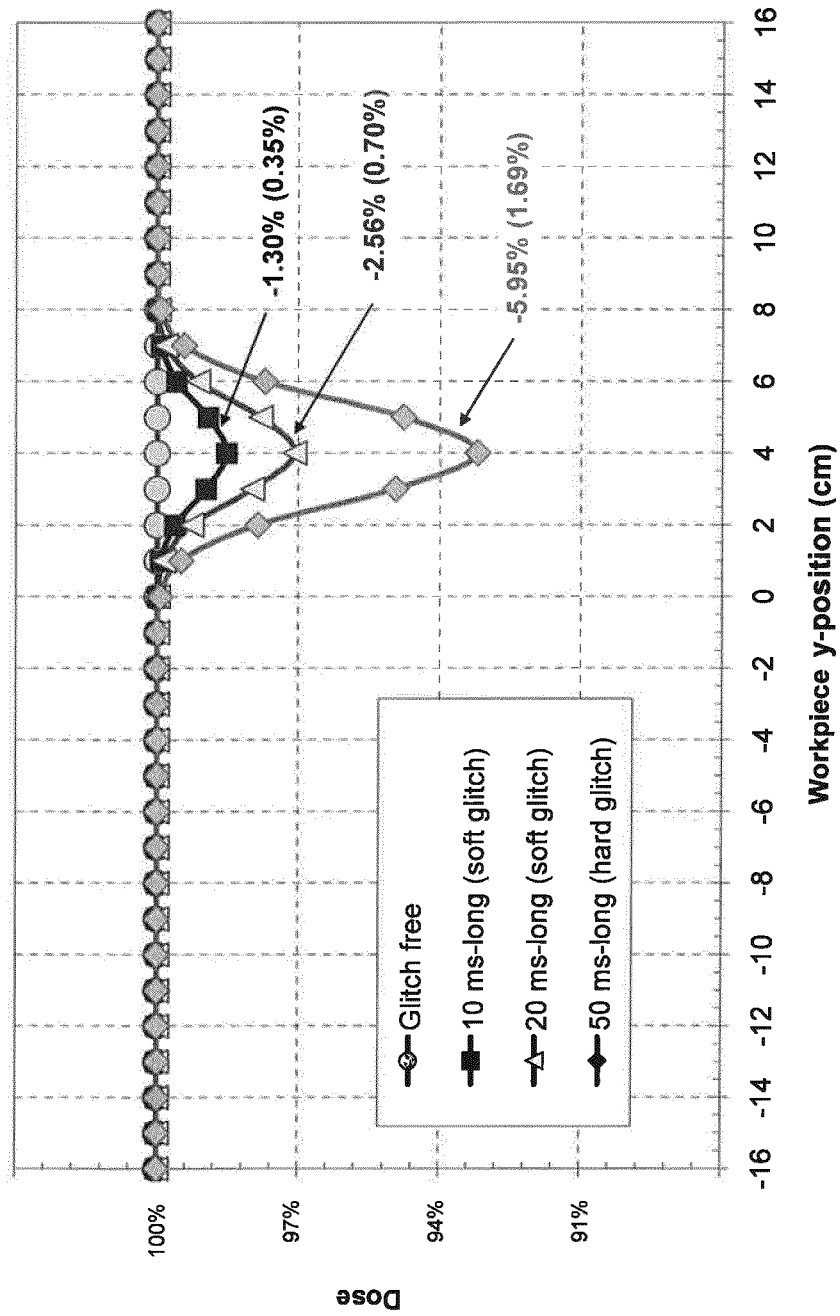
FIG. 2 is a chart comparing dose versus workpiece y-position.

FIG. 2 is a chart comparing dose versus workpiece y-position. This illustrates a single glitch on the dose uniformity for a workpiece, which in this instance is a solar cell. This example is based on an implant with eight scans or passes. The total dose may be between approximately $1E15$ $cm^{-2}$ and $1E16$ $cm^{-2}$ in one instance. The line scans are illustrated for various glitch durations. The impact on the dose is reported as a local dose loss and whole workpiece dose non-uniformity. As seen, the effect on dose of a 50 ms glitch is larger than that of a 10 ms glitch.

It was been experimentally determined that the field region for an SE solar cell is not as sensitive as a semiconductor wafer to the absolute dose. Other solar cell architectures or workpieces may have similar sensitivities with respect to a semiconductor wafer. Thus, while a semiconductor wafer may need near-perfect repair of the dose, a solar cell or other workpiece may need far less precise repair. Short circuit current density, $J_{sc}$, and open circuit voltage, $V_{oc}$, do not change rapidly as a function of dose. For some implants with a ±15% change in dose, approximately no change for $J_{sc}$ or $V_{oc}$ may occur.

Additionally, the dose needed for contacting or adding metal contacts to the solar cell may only require a certain dose to properly function. An increase in dose may be beneficial for forming improved metal contacts. Fill factor, FF, and series resistance, $R_{series}$, can be used as a proxy for contact quality. It has been shown that FF increases and $R_{series}$ decreases as a function of increasing dose.

Glitch detection may be performed multiple ways. For example, a faraday cup or other detection device can monitor beam current in the implanter. In another example, the power supply units are monitored. Drops in current from one of the power supply units may indicate that a glitch occurred or is occurring. Other measurements to the beam current in the implanter also can detect glitches. A controller, which may be a computer or other processor, can receive signals and compensate for any detected glitches. This controller can determine where on the workpiece or workpieces the glitch occurred and use this information to compensate for the glitch.

Figure 10:
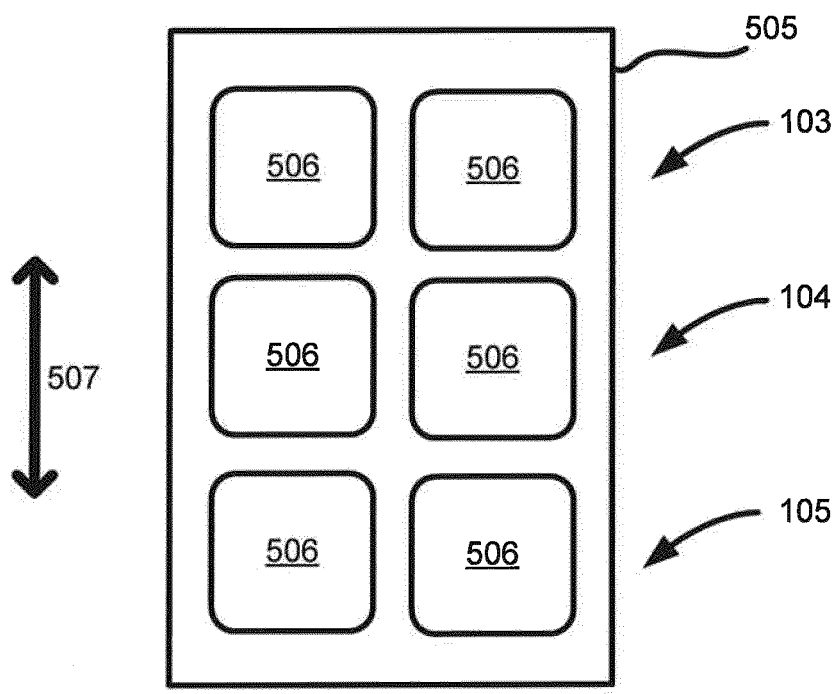
FIG. 10 is one embodiment of a front perspective view of an arrangement of workpieces on a platen.

Glitches may have a varying duration. Some glitches may be more than 50 ms, though other lengths are of course possible. In one instance using a ribbon beam, the glitch is a line across an entire surface of a workpiece. In another instance using a spot beam, the glitch may be a dot on the surface of the workpiece. It is assumed in these embodiments that the solar cells or other workpieces are disposed on a platen in a 2×3 arrangement with multiple passes or scans during implant. Such an arrangement is illustrated in FIG. 10. A total of six workpieces 506 are arranged on the platen 505. These workpieces 506 are disposed in a first workpiece pair 103, second workpiece pair 104, and third workpiece pair 105, which refer to the workpieces 506 in the horizontal direction. The workpieces 506 scan in the direction 507. Of course, other configurations or implant methods are possible. For example, a single workpiece, two workpiece, three workpieces in a 1×3 arrangement, or four workpieces in a 2×2 arrangement may be implanted. All may benefit from the embodiments disclosed herein. While scanning the workpiece is specifically mentioned, scanning the ion beam or a combination of scanning the ion beam and workpiece also may be performed. If a glitch occurs during a blanket implant of a workpiece, or a uniform implant over an entire surface of a workpiece, there are at least five responses.

Figure 3:
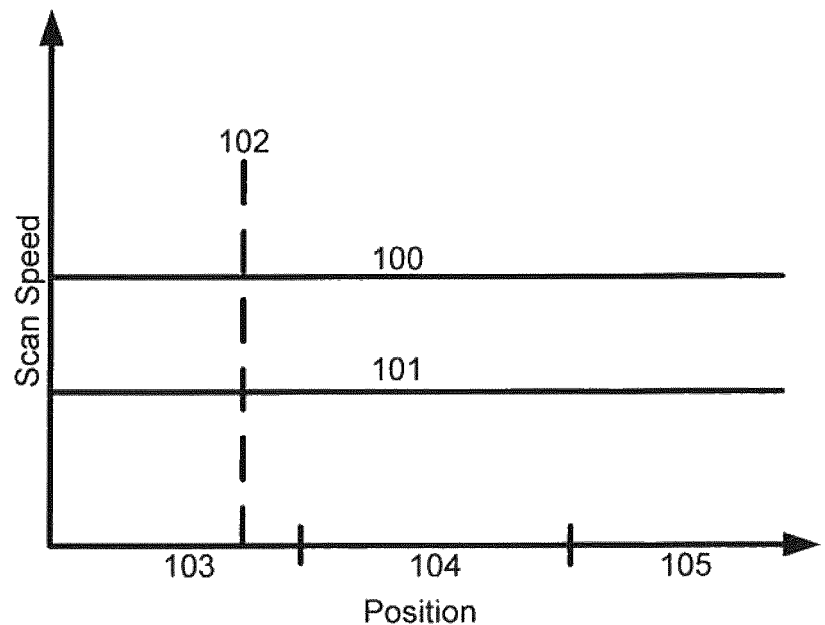
FIG. 3 is a chart comparing scan speeds versus platen position in a first embodiment.

The pass following a glitch may be intentionally slowed compared to the previous pass to over-dose all six workpieces in the 2×3 configuration. FIG. 3 is a chart comparing scan speeds versus platen position in a first embodiment. The x-axis position includes three workpieces in a 2×3 arrangement broken into a first workpiece pair 103, second workpiece pair 104, and third workpiece pair 105. The glitch occurs at position 102 of the first workpiece pair 103 during the first implant pass 100, which occurs at a first speed. Thus, only the first workpiece pair 103 is affected by the glitch and a region of uneven dose occurs in this first workpiece pair 103. A second implant pass 101 is performed or added to increase the dose on every workpiece. This second implant pass 101 occurs at a second speed and is slowed compared to the first speed of first implant pass 100. Thus, most or all of the workpieces will be over-dosed and the position 102 will have an implant dose at least equal to the desired value, if not higher.

Figure 4:
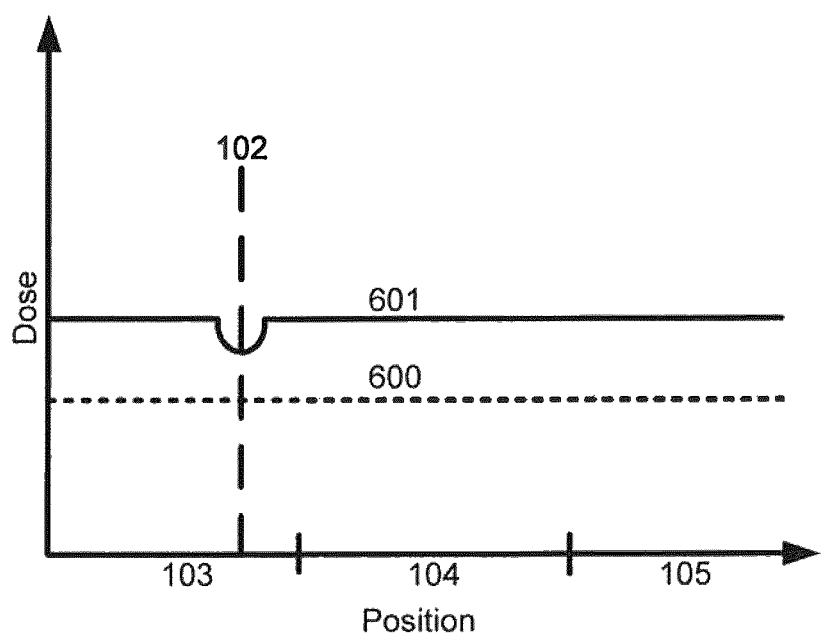
FIG. 4 is a chart illustrating dose versus platen position corresponding to the embodiment of FIG. 3.

FIG. 4 is a chart illustrating dose versus platen position corresponding to the embodiment of FIG. 3. In FIG. 4, the first workpiece pair 103, second workpiece pair 104, and third workpiece pair 105 are illustrated and correspond to FIG. 3. The position 102 where the glitch occurs also corresponds to FIG. 3. A desired dose level 600 is illustrated (represented by the horizontal dashed line). Since the second implant pass from FIG. 3 was slowed compared to the first implant pass, the actual dose level 601 is larger than the desired dose level 600 for all workpieces. Even the region around the position 102 where the glitch occurs has a higher dose than the desired dose level 600.

Figure 5:
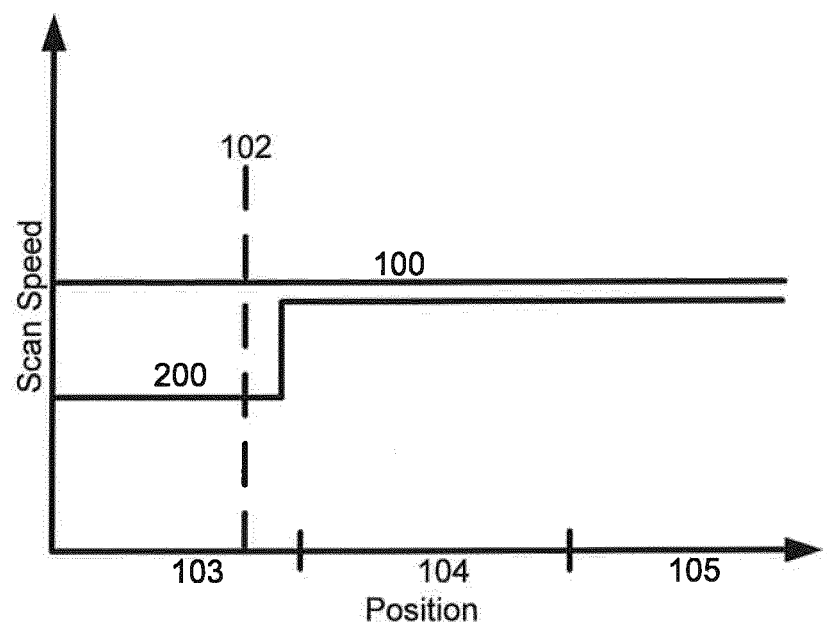
FIG. 5 is a chart comparing scan speeds versus platen position in a second embodiment.

The pass following a glitch may be slowed for the row or pair of workpieces affected by the glitch to intentionally over-dose those workpieces. FIG. 5 is a chart comparing scan speeds versus platen position in a second embodiment. As with the embodiment of FIG. 3, in FIG. 5 a glitch occurs at position 102 of the first workpiece pair 103 during the first implant pass 100, which occurs at a first speed. Thus, only the first workpiece pair 103 is affected by the glitch and a region of uneven dose occurs in this first workpiece pair 103. A second implant pass 200 is performed or added. The second implant pass 200 is at a second speed, slower than the first speed, for the first workpiece pair 103 affected by the glitch, and a third speed, faster than the second speed, for the other workpieces that were not affected by the glitch. This third speed during the second implant pass 200 may be faster than, slower than, or approximately equal to the first speed of the first implant pass 100 in one instance. FIG. 5 merely illustrates the speed of the first implant pass 100 as different from the speed of the second implant pass 200 for simplicity. This will increase the dose primarily on the workpiece affected by the glitch and may increase throughput with respect to the embodiment of FIG. 3.

Figure 6:
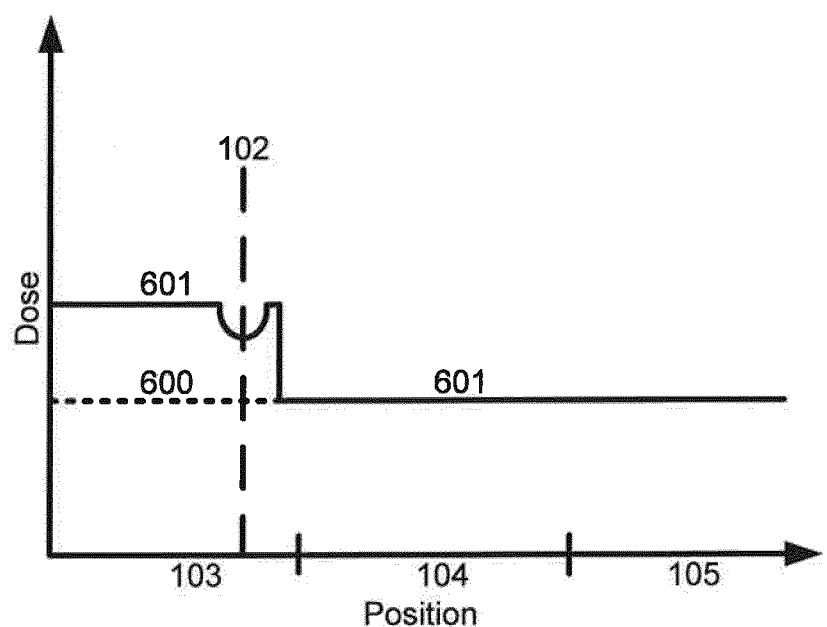
FIG. 6 is a chart illustrating dose versus platen position corresponding to the embodiment of FIG. 5.

FIG. 6 is a chart illustrating dose versus platen position corresponding to the embodiment of FIG. 5. In FIG. 6, the first workpiece pair 103, second workpiece pair 104, and third workpiece pair 105 are illustrated and correspond to FIG. 5. The position 102 where the glitch occurs also corresponds to FIG. 5. A desired dose level 600 is illustrated. Since the second implant pass from FIG. 5 was slowed compared to the first implant pass for the first workpiece pair 103, the actual dose level 601 is larger than the desired dose level 600 for the first workpiece pair 103. With the second workpiece pair 104 and third workpiece pair 105, the actual dose level 601 may be approximately the same as the desired dose level 600.

Figure 7:
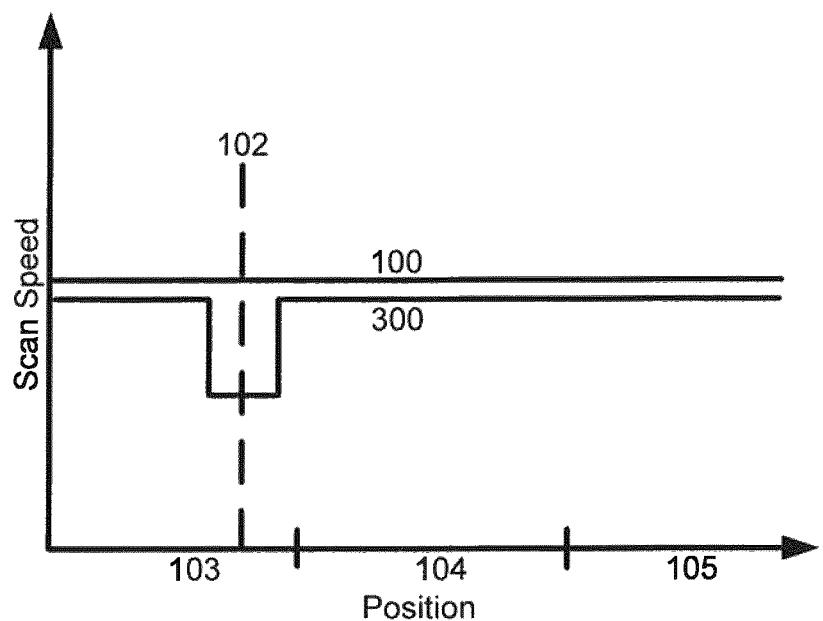
FIG. 7 is a chart comparing scan speeds versus platen position in a third embodiment.

The pass following a glitch may be slowed only over the specific area of the workpiece where the glitch occurred to refill the lost dose on the workpieces. This may minimize the effect on any workpieces not affected by the glitch. FIG. 7 is a chart comparing scan speeds versus platen position in a third embodiment. As with the embodiments of FIGS. 3 and 5, in FIG. 7 a glitch occurs at position 102 of the first workpiece pair 103 during the first implant pass 100 at a first speed. Thus, only the first workpiece pair 103 is affected by the glitch and a region of uneven dose occurs in this first workpiece pair 103. A second implant pass 300 is added or performed. The second implant pass 300 slows only for the region around the glitch at position 102. Thus, in the region around the glitch at the position 102, a second speed, slower than the first speed, occurs. For the rest of the areas of the workpieces, the second implant pass 300 occurs at a third speed, which is faster than the second speed. This third speed of the second implant pass 300 may be at a speed slower than, faster than, or approximately equal to that of the first speed of the first implant pass 100 in one instance. FIG. 7 merely illustrates the speed of the first implant pass 100 as different from the speed of the second implant pass 300 for simplicity. This will increase the dose only on the area of the workpiece affected by the glitch and may reduce throughput loss compared to the embodiments of FIGS. 3 and 5.

Figure 8:
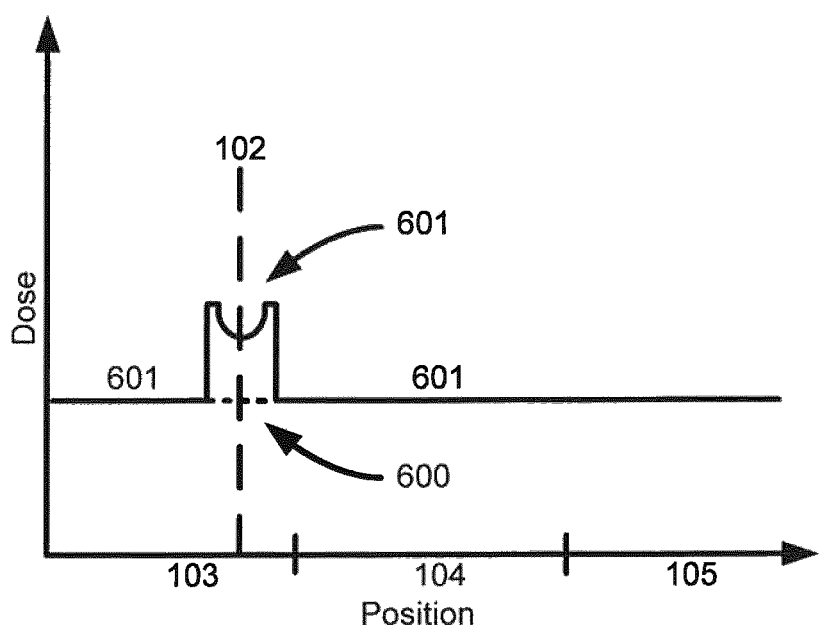
FIG. 8 is a chart illustrating dose versus platen position corresponding to the embodiment of FIG. 7.

FIG. 8 is a chart illustrating dose versus platen position corresponding to the embodiment of FIG. 7. In FIG. 8, the first workpiece pair 103, second workpiece pair 104, and third workpiece pair 105 are illustrated and correspond to FIG. 7. The position 102 where the glitch occurs also corresponds to FIG. 7. A desired dose level 600 is illustrated. Since the second implant pass from FIG. 7 was slowed compared to the first implant pass for the region around the glitch at position 102, the actual dose level 601 is larger than the desired dose level 600 for this region around the position 102. With the remainder of the first workpiece pair 103 and all of the second workpiece pair 104 and third workpiece pair 105, the actual dose level 601 may be approximately the same as the desired dose level 600.

While slowing the second implant passes is disclosed in FIGS. 3, 5, and 7, these second implant passes also may be faster or equal in speed to the first implant pass. In such an instance, higher throughput may be desired or only a small additional dose is needed to compensate for the glitch. For example, for a small glitch, the second implant; pass may be faster than the first implant pass to compensate. In this example, the combined dose from the first implant pass and second implant pass is approximately equal to or greater than the desired dose level.

One or more additional pass also may be added to over-dose all workpieces. The additional pass or passes may be performed at the same speed or different speeds as the standard implant passes. For example, the additional passes may be at a faster speed than the initial implant passes. While one additional pass may be added, two or more additional passes may be added. In one specific instance, an odd number of passes is added and the to return pass is "blanked" such that no beam implants the workpieces. For example, during blanking the arc may be quenched, the ion beam directed away from the workpiece, the beam may be blocked, or the platen is rotated to shadow the workpieces from the beam. Adding an even number of passes may be simpler for workpiece handling purposes. For example, two passes at a faster speed than the initial implant passes are added. This may be combined with the embodiments of FIG. 3, 5, or 7 in one instance or may be a method of glitch compensation separate from the embodiments of FIG. 3, 5, or 7.

While the embodiments of FIGS. 3, 5, and 7 illustrated a single glitch at position 102 in the first workpiece pair 103, multiple glitches may occur. These multiple glitches can occur on the same workpiece or workpiece pair. These multiple glitches also can occur in multiple workpieces or different workpiece pairs. The embodiments of FIGS. 3, 5, and 7 can be applied if multiple glitches occur. For example, an implant pass may be slowed for multiple workpiece passes or around multiple positions where a glitch occurred.

Figure 9:
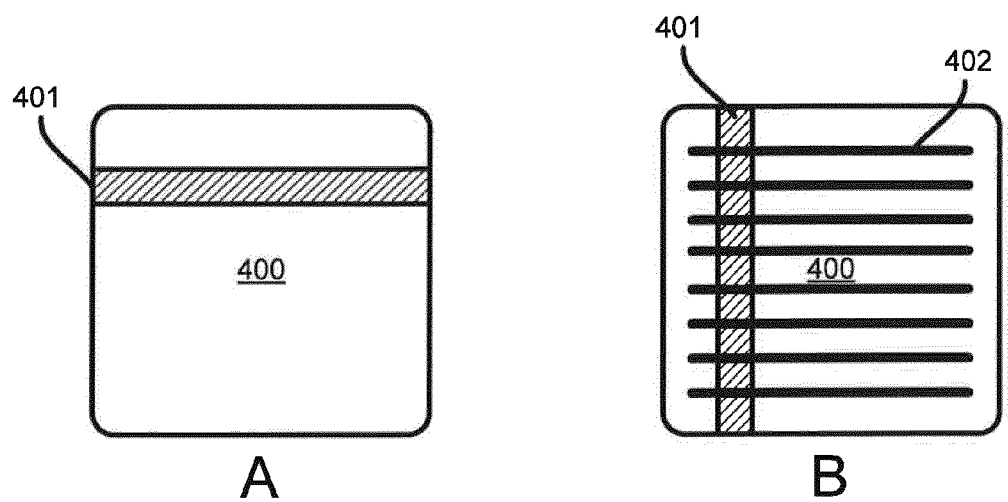
FIGS. 9A-B are a top perspective view of rotating a workpiece to reduce the effects of glitching.

The workpiece affected by the glitch also may be rotated by 90° prior to printing the metal contacts on its surface. This will allow the metal lines to be orthogonal to the missing dose region. This may be better than the alternative of having a few metal lines miss a correctly doped region. FIGS. 9A-B are a top perspective view of rotating a workpiece to reduce the effects of glitching. As illustrated in FIG. 9A, the workpiece 400 includes a region 401 with a different dose due to a glitch that occurred during implantation. In FIG. 9B, the workpiece 400 has been rotated 90°. The metal lines 402 are disposed on the workpiece 400 perpendicular to the region 401 to reduce the negative effects of the lower dose in the region 401. Of course, the pattern of the metal lines 402 also may skip the region 401 and run parallel to the region 401, but this may limit or reduce the energy collected from the workpiece 400. In one instance, workpiece handling systems may rotate the workpiece 400 prior to the metallization steps that create the metal lines 402. In one particular embodiment, the workpiece 400 with the region 401 or others with a region 401 are rotated prior to metallization while other workpieces are not rotated prior to metallization. In another particular embodiment, all workpieces including the workpiece 400 are rotated prior to metallization.

Glitches may be more complicated with selective implants. A selective implant only implants a portion of the workpiece. For example, a series of higher dose lines may be implanted during a selective implant. Photoresist, an oxide, a stencil mask, or a shadow mask may be used to enable selective implants. If a glitch occurs during a selective implant, any of the embodiments listed for blanket implants may be used except the embodiment of FIG. 9 where the workpiece is rotated 90° prior to printing the metal contacts. Then the metal contacts would be misaligned or not aligned to any heavily doped region. For the embodiments of FIG. 3, 5, or 7 or the use of additional passes, the mask can remain in place during the implants that: include different speeds or for the additional passes. This will result in additional dose for all or some of the selective implant.

Slowing the scan speed for the least amount of time has the least impact on throughput, which may be desirable for solar cells or other workpieces that require high throughput. All solutions, however, improve the yield for solar cell implants. To use the embodiments herein, the implanter may use a measurement system to monitor potential glitches and a controller connected to the scan system for the ion beam or platen. This controller may modify the scan or implant to compensate for glitches. Such modification may take into account the overall throughput impact and may select the best solution to the glitch. Factors such as the position of the glitch on the workpiece, the size of the glitch on the workpiece, the duration of the glitch, the number of passes for the desired dose level, the particular layer or region of the workpiece being implanted, or the type of workpiece or solar cell architecture being implanted may be considered to determine the best glitch solution. This best solution may be based on a desired throughput or solar cell architecture, for example. And while the embodiments disclosed herein are all related to fixing glitches, the solution in some instances may be to ignore a glitch altogether. For example, if glitches occur on multiple different workpieces, one solution may be to ignore a glitch on one workpiece while repairing a glitch on another workpiece. This ignored glitch may not have enough of an impact on the workpiece to justify the lower throughput caused by fixing this particular glitch.

This controller also may add passes or otherwise select the best solution to the glitch taking into account a minimum dose needed on the workpiece, such as, for example, the desired dose level 600. Uniformity across the workpieces or individual workpieces may be ignored as long as the minimum dose is implanted. Such a minimum dose may be calculated based on the needs for contact formation or emitter formation, for example. The number of passes or speed of the individual passes is configured to implant this minimum dose in one embodiment.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of ion implantation comprising:
   implanting an entire surface of a first workpiece during a first pass at a first speed, wherein said first pass results in a region of uneven dose in said first workpiece; and
   implanting said entire surface of said first workpiece during a second pass at a second speed, wherein said second speed is different from said first speed.

2. The method of claim 1, further comprising detecting said region of uneven dose.

3. The method of claim 1, wherein said region of uneven dose is a line across a width of said workpiece or a spot on said workpiece.

4. The method of claim 1, wherein said second speed corresponds to said first workpiece.

5. The method of claim 1, wherein said second speed corresponds to said region of uneven dose in said workpiece.

6. The method of claim 1, wherein said first pass results in a first dose in said workpiece and said second pass results in a second dose in said workpiece, wherein said second dose is larger than said first dose.

7. The method of claim 1, further comprising implanting an entire surface of at least a second workpiece during said first pass, wherein said region of uneven dose does not occur in said second workpiece.

8. The method of claim 7, wherein said entire surface of said first workpiece and said entire surface of said second workpiece are implanted at said second speed during said second pass.

9. The method of claim 7, wherein said entire surface of said first workpiece is implanted at said second speed during said second pass, and wherein said entire surface of said second workpiece is implanted at a third speed during said second pass, wherein said third speed is greater than said second speed.

10. The method of claim 9, wherein said third speed is equal to said first speed.

11. The method of claim 7, wherein said second speed corresponds to said region of uneven dose in said workpiece, and wherein said entire surface of said second workpiece and part of said entire surface of said first workpiece are implanted at a third speed during said second pass, wherein said third speed is greater than said second speed.

12. The method of claim 11, wherein said third speed is equal to said first speed.

13. The method of claim 7, further comprising implanting a third workpiece and a fourth workpiece in a 2×2 arrangement during said first pass, wherein said region of uneven dose only occurs in said first workpiece and said third workpiece.

14. The method of claim 7, further comprising implanting a third workpiece, a fourth workpiece, a fifth workpiece, and a sixth workpiece in a 2×3 arrangement during said first pass, wherein said region of uneven dose only occurs in said first workpiece and said fourth workpiece.

15. The method of claim 1, wherein said workpiece comprises a solar cell.

16. A method of workpiece manufacturing comprising:
implanting a workpiece, wherein said implanting results in a region of uneven dose in said workpiece; and
applying metal contacts to said workpiece, wherein said metal contacts are applied orthogonal to said region of uneven dose.

17. The method of claim 16, further comprising detecting said region of uneven dose.

18. The method of claim 16, wherein said region of uneven dose is a line across a width of said workpiece.

19. The method of claim 16, wherein said workpiece comprises a solar cell.

20. A method of ion implantation comprising:
implanting an entire surface of at least one workpiece at a first speed;
detecting a region of uneven dose in said workpiece caused by said implanting; and
performing additional implantation into said entire surface of said workpiece at a second speed whereby an entirety of said workpiece has a larger dose after said additional implantation than after said implanting.

21. The method of claim 20, wherein said additional implantation comprises an even number of implant passes.

22. The method of claim 20, wherein said additional implantation comprises an odd number of implant passes and wherein said workpiece is not implanted during at least one pass.

23. The method of claim 20, wherein said workpiece comprises a solar cell.

* * * * *